United States Patent
Um

(10) Patent No.: US 10,365,528 B2
(45) Date of Patent: Jul. 30, 2019

(54) ARRAY SUBSTRATE, METHOD OF MANUFACTURING THE SAME, DISPLAY PANEL AND DISPLAY DEVICE

(71) Applicant: BOE TECHNOLOGY GROUP CO., LTD., Beijing (CN)

(72) Inventor: Yoon-Sung Um, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/801,624

(22) Filed: Nov. 2, 2017

(65) Prior Publication Data

US 2018/0246385 A1 Aug. 30, 2018

(30) Foreign Application Priority Data

Feb. 28, 2017 (CN) .......................... 2017 1 0114666

(51) Int. Cl.
  *G09G 3/20* (2006.01)
  *G09G 3/36* (2006.01)
  *G02F 1/1362* (2006.01)
  *H01L 27/12* (2006.01)
  *G02F 1/1343* (2006.01)

(52) U.S. Cl.
  CPC .. *G02F 1/136286* (2013.01); *G02F 1/136209* (2013.01); *H01L 27/124* (2013.01); *H01L 27/1259* (2013.01)

(58) Field of Classification Search
  CPC ......... G02F 1/136286; G02F 1/136209; G02F 2201/40; H01L 27/124; H01L 27/1255
  See application file for complete search history.

(56) References Cited

U.S. PATENT DOCUMENTS

| 2001/0022565 A1* | 9/2001 | Kimura | G09G 3/3266 345/82 |
| 2005/0270444 A1* | 12/2005 | Miller | G09G 3/3216 349/108 |
| 2007/0002084 A1* | 1/2007 | Kimura | H01L 27/3216 345/694 |

(Continued)

FOREIGN PATENT DOCUMENTS

| CN | 105629610 A | 6/2016 |
| CN | 106057820 A | 10/2016 |
| CN | 106405967 A | 2/2017 |

OTHER PUBLICATIONS

First Office Action for Chinese Patent Application No. 201710114666.3 dated Apr. 19, 2019.

*Primary Examiner* — Brian Turner
(74) *Attorney, Agent, or Firm* — Calfee, Halter & Griswold LLP

(57) ABSTRACT

The present disclosure relates to an array substrate, a method of manufacturing the same, a display panel and a display device. The array substrate includes: a plurality of pixel units, the plurality of pixel units being arranged in rows and columns and each row of the pixel units comprising a first sub-pixel row, a second sub-pixel row and a third sub-pixel row being adjacent successively; and a plurality of gate lines, each of the gate lines being configured to drive one sub-pixel row, and gate lines for driving the first sub-pixel row and the second sub-pixel row in a same pixel unit being located between the first sub-pixel row and the second sub-pixel row in the pixel unit.

14 Claims, 7 Drawing Sheets

(56) References Cited

U.S. PATENT DOCUMENTS

| | | | | |
|---|---|---|---|---|
| 2013/0135183 A1* | 5/2013 | Kimura | ............... | H01L 27/3216 345/76 |
| 2015/0092025 A1* | 4/2015 | Chang | ................ | G02B 27/2214 348/54 |
| 2015/0362809 A1* | 12/2015 | Wang | ................ | G02F 1/136286 257/532 |
| 2015/0371583 A1* | 12/2015 | Guo | ..................... | G09G 3/2074 345/694 |

* cited by examiner

ARRAY SUBSTRATE, METHOD OF MANUFACTURING THE SAME, DISPLAY PANEL AND DISPLAY DEVICE

CROSS-REFERENCES TO RELATED APPLICATIONS

This application claims priority to Chinese Patent Application No. 201710114666.3 filed in China on Feb. 28, 2017, the entire contents of which are hereby incorporated by reference.

TECHNICAL FIELD

The present disclosure relates to the field of display technology and, more particularly, to an array substrate, a method of manufacturing the same, a display panel and a display device.

BACKGROUND

With development of display technology, a liquid crystal display has gradually replaced a traditional CRT display and becomes mainstream of the panel display. In the liquid crystal display technology field, a TFT-LCD (Thin Film Transistor Liquid Crystal Display) has been widely used in fields of television sets, computers, mobile phones and the like by virtue of its large size, flexible process, excellent performance and low cost.

As one of main parts of the TFT-LCD, the display panel generally includes an array substrate, a color film substrate, and liquid crystals between the array substrate and the color film substrate. In the array substrate, a plurality of crisscross gate lines and data lines intersect to define a plurality of pixel units. In the prior art, a gap between the gate line and the pixel unit may cause a halo in periphery of the gate line when the display panel is operating normally. In this case, a BM (Black Matrix) is usually used to cover the halo. However, the larger a BM width is, the smaller a light transmission region under the same display area will be, which is disadvantageous to the development requirement of the high aperture ratio of the liquid crystal display panel.

In view of this, a novel array substrate, a method of manufacturing the same, a display panel and a display device are required.

It should be noted that, information disclosed in the above background portion is provided only for better understanding of the background of the present disclosure, and thus it may contain information that does not form the prior art known by those ordinary skilled in the art.

SUMMARY

The present disclosure aims to provide an array substrate, a method of manufacturing the same, a display panel and a display device.

According to one aspect of the present disclosure, there is provided an array substrate, including:

a plurality of pixel units, the plurality of pixel units being arranged in rows and columns and each row of the pixel units including a first sub-pixel row, a second sub-pixel row and a third sub-pixel row being adjacent successively; and a plurality of gate lines, each of the gate lines being configured to drive one sub-pixel row, and gate lines for driving the first sub-pixel row and the second sub-pixel row in a same pixel unit being located between the first sub-pixel row and the second sub-pixel row in the pixel unit.

According to one aspect of the present disclosure, there is provided a display panel including any one of the array substrate described above.

According to one aspect of the present disclosure, there is provided a display device including any one of the display panel described above.

According to one aspect of the present disclosure, there is provided a method of manufacturing an array substrate, including:

forming a plurality of pixel units arranged in rows and columns, wherein each row of the pixel units includes a first sub-pixel row, a second sub-pixel row and a third sub-pixel row being adjacent successively; and forming a plurality of gate lines, wherein each of the gate lines is configured to drive one sub-pixel row, and gate lines for driving the first sub-pixel row and the second sub-pixel row in a same pixel unit are configured to be located between the first sub-pixel row and the second sub-pixel row in the pixel unit.

It is to be understood that both the foregoing general description and the following detailed description are exemplary and explanatory only and are not restrictive of the present disclosure, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. It will be apparent that the drawings in the following description are merely some embodiments of the present disclosure. Other drawings may be obtained by those skilled in the art based on these drawings without paying for creative labor. In the drawings.

DETAILED DESCRIPTION

Figure 1:
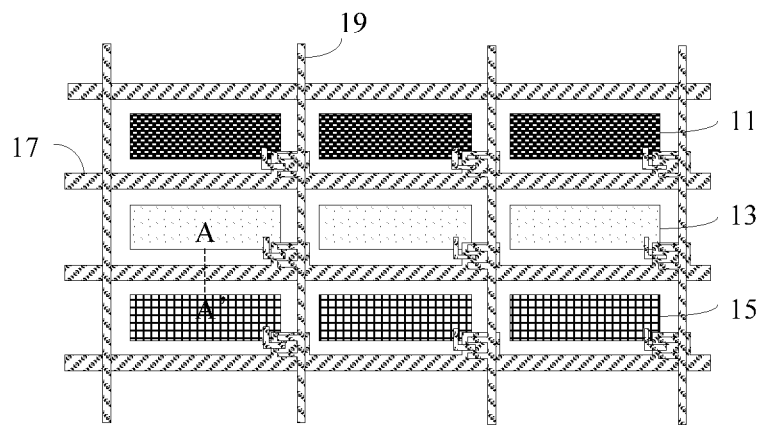
FIG. 1 schematically shows a top view of an array substrate.

Exemplary embodiments will now be described more fully with reference to the drawings. The exemplary embodiments, however, may be implemented in various forms, and should not be construed as been limited to the implementations set forth herein; instead, the implementations are provided such that the present disclosure will be through and complete, and will fully convey the concept of exemplary embodiments to those skilled in the art. The features, structures or characteristics described herein can be combined in one or more embodiments in any appropriate way. In the description hereinafter, many specific details are provided for fully understanding of the embodiments of the present disclosure. However, it will be appreciated by those skilled in the art that the technical solution of the present disclosure can be practiced without one or more of the specific details, or with other methods, components, devices or steps etc. In other cases, known technical solutions will not be illustrated or described in detail, to avoid obscuration of the aspects of the present disclosure due to distraction.

The flowchart shown in the drawings is merely illustrative and not necessarily to include all steps. For example, some steps may be divided, and some steps may be combined or partially combined, and the actual execution order may be changed according to actual situations.

FIG. 1 shows a top view of a part of an array substrate. In FIG. 1, the array substrate includes three pixel units. A structure consisting of the three pixel units may include a first sub-pixel row 11, a second sub-pixel row 13 and a third sub-pixel row 15. The first sub-pixel row may be a first color sub-pixel row, the second sub-pixel row may be a second color sub-pixel row, and the third sub-pixel row may be a third color sub-pixel row. In addition, the array substrate further includes a plurality of gate lines 17 and a plurality of data lines 19. In the array substrate, each of the plurality of gate lines 17 may be used to drive one sub-pixel row and located below the driven sub-pixel row.

Referring to FIG. 1, a length of the dotted line AA' is a distance between the second sub-pixel row 13 and the third sub-pixel row 15. That is, the length of the dotted line AA' may be a width of a BM between the second sub-pixel row 13 and the third sub-pixel row 15.

Figure 2:
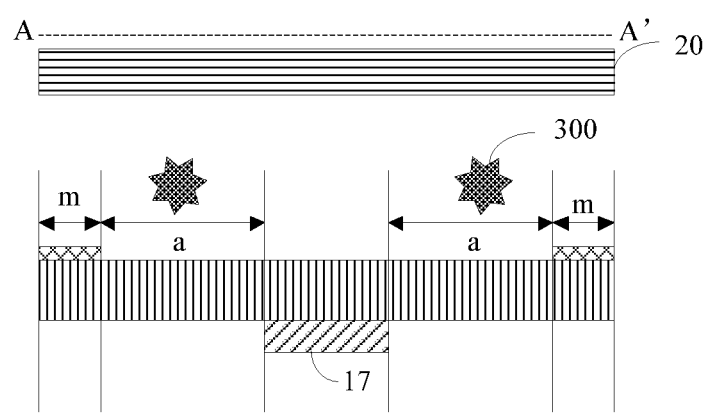
FIG. 2 schematically shows a cross-sectional view of the display panel taken along a dashed line AA' in FIG. 1.

FIG. 2 schematically shows a cross-sectional view of the display panel taken along a dashed line AA' in FIG. 1. Since a large voltage difference is generated between the gate line 17 and the sub-pixel and the common electrode, a halo 300 will be generated at two sides of the gate line 17. If the width of the BM 20 between the second sub-pixel row 13 and the third sub-pixel row 15 is denoted as $W_{20}'$, $W_{20}'$ may be expressed as follows:

$$W_{20}'=W_{gate}+2*a+2*m$$

where $W_{gate}$ denotes a width of the gate line 17, a denotes a width of the halo 300 formed between the gate line 17 and one sub-pixel, and m denotes an assay margin of the display panel.

Since a distance between every adjacent two sub-pixel rows in FIG. 1 is the same and equals to $W_{20}'$, a total BM width $W_{BM}'$ of an array substrate consisting of one pixel unit in a longitudinal direction and three pixel units in a horizontal direction as shown in FIG. 1 may be expressed as:

$$W_{BM}'=3*W_{20}'=3*W_{gate}+3*2*a+3*2*m$$

The present disclosure provides a novel array substrate, including: a plurality of pixel units, the plurality of pixel units being arranged in rows and columns and each row of the pixel units including a first sub-pixel row, a second sub-pixel row and a third sub-pixel row being adjacent successively; and a plurality of gate lines, each of the gate lines being configured to drive one sub-pixel row, and gate lines for driving the first sub-pixel row and the second sub-pixel row in a same pixel unit being located between the first sub-pixel row and the second sub-pixel row in the pixel unit.

By arranging gate lines for driving the first sub-pixel row and the second sub-pixel row in the same pixel unit to be between the first sub-pixel row and the second sub-pixel row in the pixel unit, the width of the BM of the display panel is reduced, an aperture ratio is increased, and the light transmission efficiency is improved.

Figure 3:
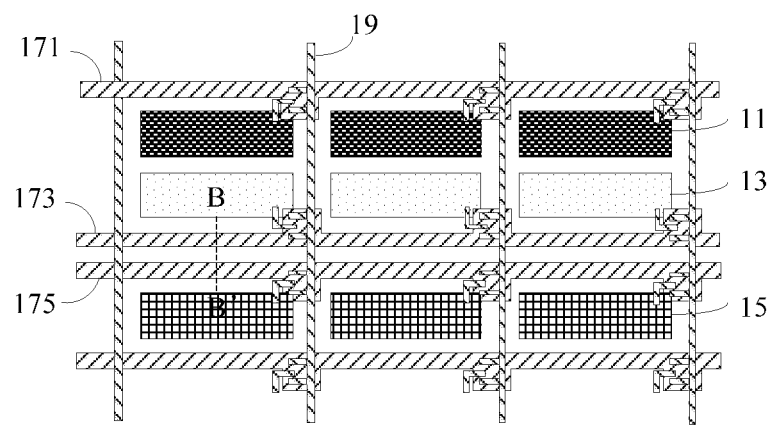
FIG. 3 schematically shows a top view of an array substrate according to an exemplary embodiment of the present disclosure.

Corresponding to the array substrate as shown in FIG. 1, FIG. 3 shows a top view of an array substrate according to an exemplary embodiment of the present disclosure. Referring to FIG. 3, similarly, the array substrate includes three pixel units and a structure consisting of the three pixel units may include a first sub-pixel row 11, a second sub-pixel row 13 and a third sub-pixel row 15. In addition, the array substrate further includes a gate line 171, a gate line 173 and a gate line 175 for driving the first sub-pixel row 11, the second sub-pixel row 13 and the third sub-pixel row 15 respectively, and a plurality of data lines 19. In the embodiment, the gate line 171 is located above the first sub-pixel row 11, the gate line 173 and the gate line 175 are located between the second sub-pixel row 13 and the third sub-pixel row 15.

In an exemplary embodiment of the present disclosure, the first sub-pixel row may be a first color sub-pixel row. The second sub-pixel row may be a second color sub-pixel row and the third sub-pixel row may be a third color sub-pixel row. It should be understood that, terms "first", "second" and "third" as used in the present disclosure are not limiting of the sub-pixel rows. In other words, in another embodiment of the present disclosure, the first sub-pixel row may be termed as the third sub-pixel row, and the third sub-pixel row may be termed as the first sub-pixel. In addition, colors of different sub-pixel rows may also be changed, and in the embodiment where one pixel unit is composed of three sub-pixels, the three colors may be R (red), G (green), and B (blue), respectively.

In view of this, the second sub-pixel row 13 as shown in FIG. 3 may be the first sub-pixel row described above, and the third sub-pixel row 15 may be the second sub-pixel row described above.

Figure 4:
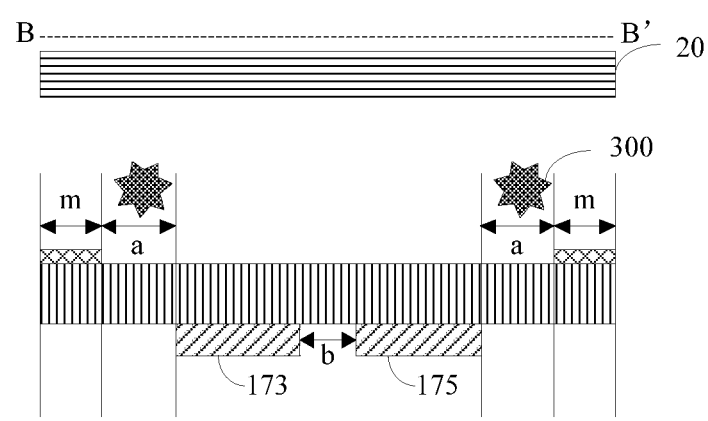
FIG. 4 schematically shows a cross-sectional view of the display panel taken along a dashed line BB' in FIG. 3.

The length of the dotted line BB' in FIG. 3 may be a BM width between the second sub-pixel row 13 and the third sub-pixel row 15. Referring to FIG. 4, a length of the dashed line BB' may be denoted as $W_{20}$, and $W_{20}$ may be expressed by the following formula:

$$W_{20}=2*W_{gate}+b+2*a+2*m$$

where b is a distance between the gate line 173 and the gate line 175.

According to some embodiments of the present disclosure, the distance between the first sub-pixel row 11 and the second sub-pixel row 13 as shown in FIG. 3 may be the width (denoted as c) of the common electrode line in the display panel. Thus, the total width $W_{BM}$ of the BM of the array substrate according to this embodiment may be expressed by the following formula:

$$W_{BM}=3*W_{gate}+b+c+2*2*a+2*2*m$$

As described above, the BM width of the array substrate according to the exemplary embodiment of the present disclosure is reduced by a width value d as compared with the BM width of the above-described array substrate, wherein:

$$d = W'_{BM} - W_{BM}$$
$$= (3^* \ W_{gate} + 3^*2^*a + 3^*2^*m) - (3^* \ W_{gate} + b + c + 2^*2^*a + 2^*2^*m)$$
$$= 2^*a + 2^*m - b - c$$

In an exemplary embodiment of the present disclosure, the width value may be averaged to each sub-pixel row, so the BM width may be reduced by d/3 as for each sub-pixel row.

In an ADS (Advanced Super Dimension Switch) type liquid crystal display device, a width "a" of the halo 300 may be about 15 μm, an assay margin m may be between 6 μm and 7 μm, a distance "b" between two gate lines may be between about 6 μm and about 7 μm, and a distance "c" between the first sub-pixel row 11 and the second sub-pixel row 13 may be between about 3 μm and 5 μm. In this case, as for an array substrate consisting of one pixel unit in a longitudinal direction and three pixel units in a horizontal direction, the BM width of the exemplary embodiment of the present disclosure is reduced by about 30 μm to about 35 μm as compared with the prior art. In addition, being averaged to each sub-pixel row, the BM width may be reduced by at least about 10 μm.

As described above, the array substrate according to the exemplary embodiment of the present disclosure may achieve a smaller BM width, and on this basis, the aperture ratio is increased and the light transmission efficiency is improved.

According to other embodiments of the present disclosure, each row of the pixel units further includes a fourth sub-pixel row adjacent to the third sub-pixel row. In the embodiment, the fourth sub-pixel row may be a fourth color sub-pixel row. In an embodiment in which one pixel unit is composed of four sub-pixels, the four colors may be R (red), G (green), B (blue), and W (white), respectively, but not limited thereto. The four colors may also be R (red), G (green), B (blue), and Y (yellow), which is not particularly limited by the present exemplary embodiment.

In addition, in an array substrate including sub-pixel rows having four colors, gate lines for driving the first sub-pixel row and the second sub-pixel row in a same pixel unit are located between the first sub-pixel row and the second sub-pixel row in the pixel unit, and gate lines for driving the third sub-pixel row and the fourth sub-pixel row in a same pixel unit are located between the third sub-pixel row and the fourth sub-pixel row in the pixel unit. In this case, the width of the BM is also reduced. The specific calculation process is similar to the above calculation process, which will not be repeated herein.

Figure 5:
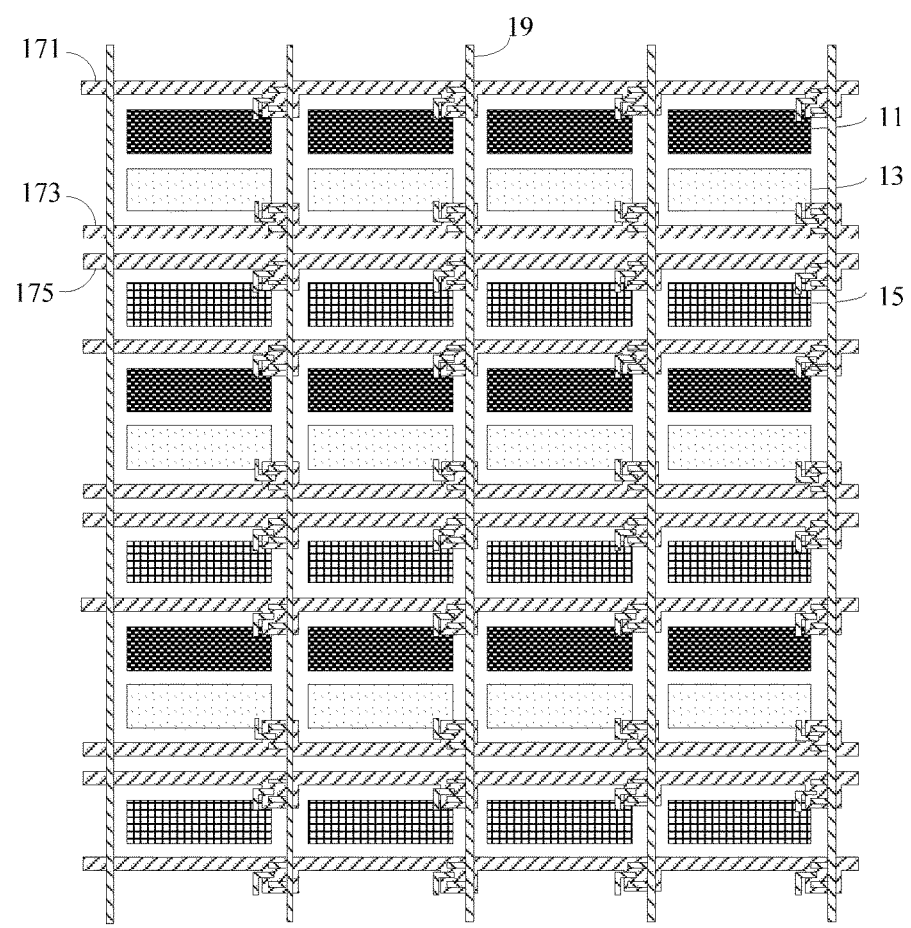
FIG. 5 schematically shows a top view of an array substrate according to a first embodiment of the present disclosure.

FIG. 5 schematically shows a top view of an array substrate according to a first embodiment of the present disclosure. In FIG. 5, although only the pixel array arranged in a manner of three pixel units in the longitudinal direction and four pixel units in the horizontal direction is shown, it will be understood by those skilled in the art that the number of pixel units included in the array substrate is not limited to 12. The array substrate may further include other pixel units arranged in the same structure around the 12 pixel units.

Each row of pixel units arranged in the horizontal direction includes a first sub-pixel row 11, a second sub-pixel row 13, a third sub-pixel row 15, and a gate line 171, a gate line 173, a gate line 175 for driving the first sub-pixel row 11, the second sub-pixel row 13 and the third sub-pixel row 15, respectively. This structure is similar to that shown in FIG. 3 and will not be repeated herein.

In addition, the array substrate may further include a plurality of data lines 19. In the pixel array arranged in a manner of a plurality of pixel units in the longitudinal direction and a plurality of pixel units in the horizontal direction, the data line 19 may be configured to provide a data signal to sub-pixels of an n-th column, and the data line 19 is located between the sub-pixels of the n-th column and a column of sub-pixels adjacent thereto, n being a positive integer.

FIG. 5 shows an embodiment arranged according to the above data line. Each data line 19 is located between adjacent two columns of sub-pixels respectively, for driving a column of sub-pixels at a left side of the data line 19. However, the data line 19 may also be used to drive a column of sub-pixels at a right side of the data line 19, which is not particularly limited in the present exemplary embodiment.

Figure 6:
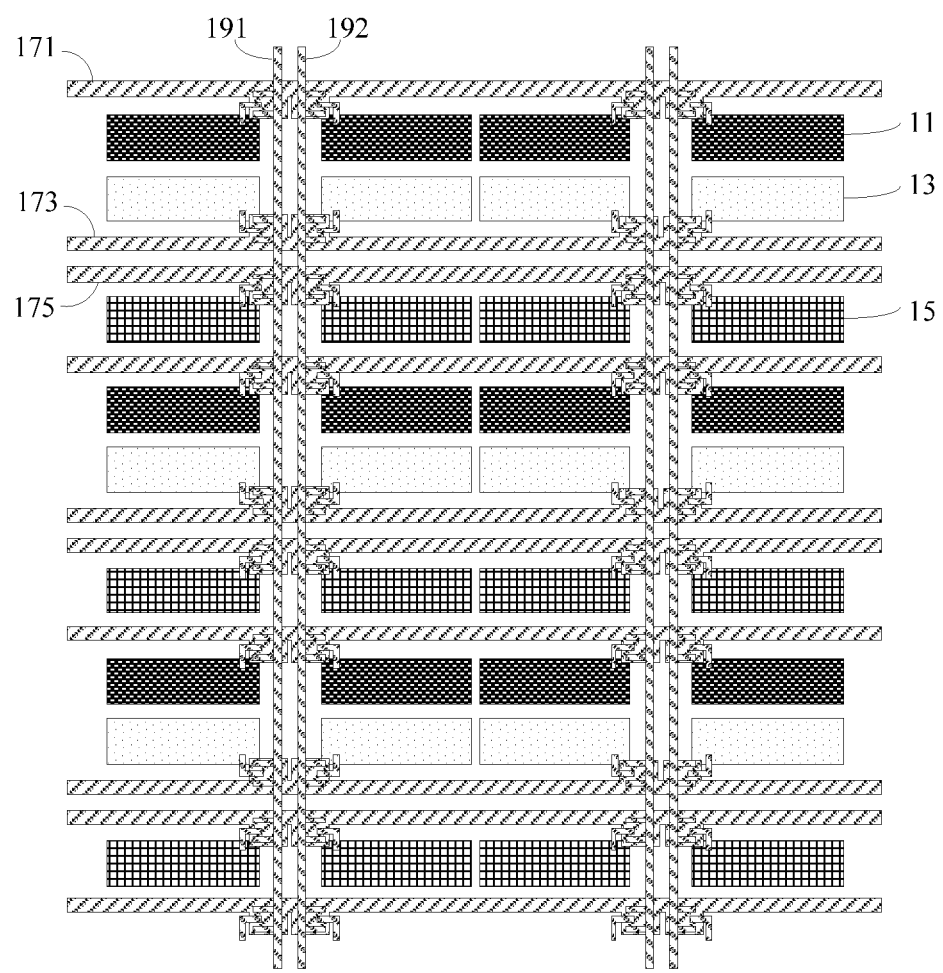
FIG. 6 schematically shows a top view of an array substrate according to a second embodiment of the present disclosure.

FIG. 6 schematically shows a top view of an array substrate according to a second embodiment of the present disclosure. Similar to the array substrate as shown in FIG. 5, in FIG. 6, the number of pixel units included in the array substrate is not limited to 12. The array substrate may further include other pixel units arranged in the same structure around the 12 pixel units.

In addition, the arrangement of each sub-pixel row and the gate line in the array substrate as shown in FIG. 6 is substantially the same as that of each sub-pixel row and the gate line in the array substrate as shown in FIG. 5, which will not be repeated herein.

In addition, the array substrate shown in FIG. 6 may include a plurality of first data lines 191 and a plurality of second data lines 192. In particular, the first data line 191 may be configured to provide a data signal to sub-pixels of an n-th column and located between the sub-pixels of the n-th column and sub-pixels of an (n+1)-th column; and the second data line 192 may be configured to provide a data signal to the sub-pixels of the (n+1)-th column and located between the first data line 191 and the sub-pixels of the (n+1)-th column. In the embodiment shown in FIG. 6, all values of the n are either odd or even.

At this time, the first data line 191 and the second data line 192 are adjacent and both located between the n-th column sub-pixels and the (n+1)-th column sub-pixels. In addition, there may be no data lines between the (n+1)-th column sub-pixels and the (n+2)-th column sub-pixels.

Figure 7:
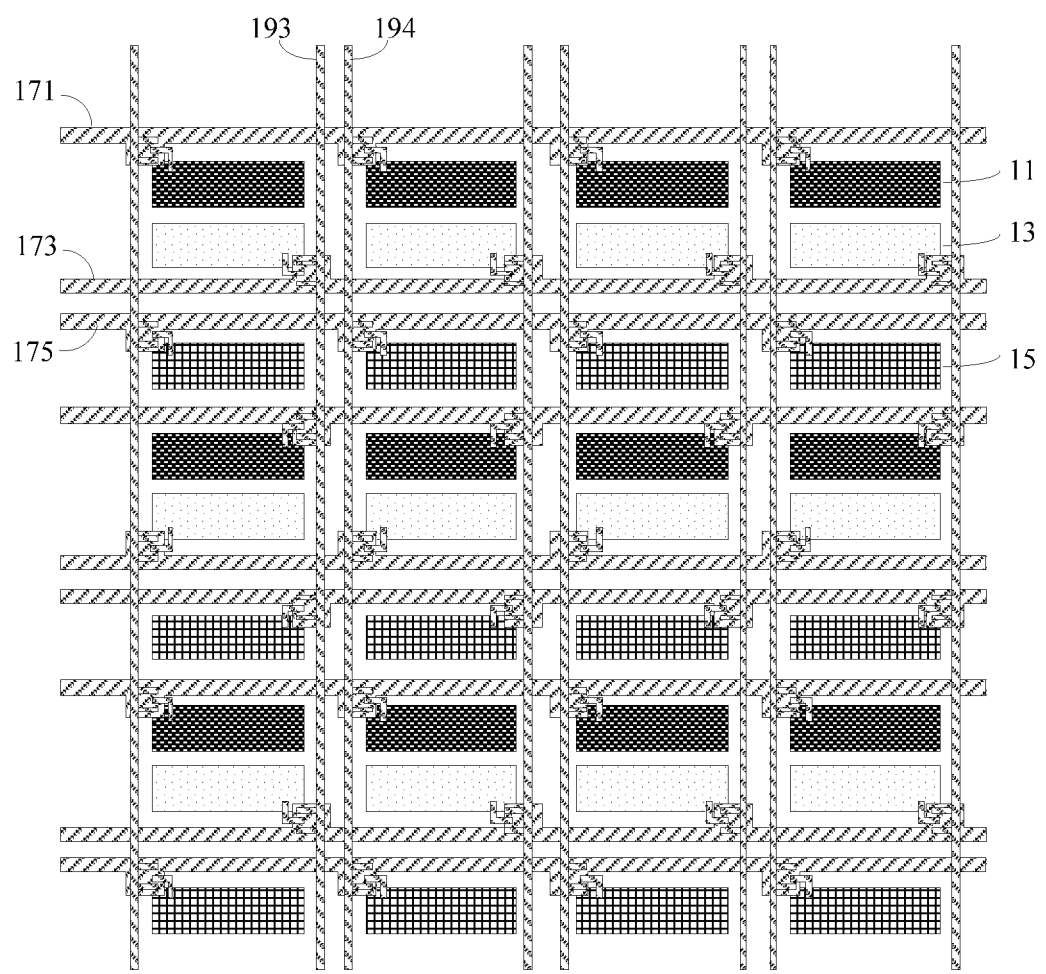
FIG. 7 schematically shows a top view of an array substrate according to a third embodiment of the present disclosure.

FIG. 7 schematically shows a top view of an array substrate according to a third embodiment of the present disclosure. Similar to the array substrate shown in FIG. 5, the array substrate in FIG. 7 may be formed by a plurality of structures shown in FIG. 7 arranged in rows and columns. In addition, the arrangement of each sub-pixel row and the gate electrode in the array substrate shown in FIG. 7 is substantially the same as that of each sub-pixel row and the gate line in the array substrate shown in FIG. 5, which will not be repeated herein.

In addition, the array substrate shown in FIG. 7 may further include a plurality of first data lines 193 and a plurality of second data lines 194. In particular, the first data line 193 may be configured to provide a data signal to sub-pixels of an i-th row and located between sub-pixels of an n-th column and sub-pixels of an (n+1)-th column; and the second data line 194 may be configured to provide a data signal to sub-pixels of an (i+1)-th row and located between the first data line 193 and the sub-pixels of the (n+1)-th column. In the embodiment shown in FIG. 7, all of the i and n are positive integers.

The main difference between the structure of the array substrate shown in FIG. 7 and the structure of the array substrate shown in FIG. 6 lies in that: the data lines in the array substrate shown in FIG. 7 provide data signals to the sub-pixels in a row manner, i.e., the first data line 193 may provide a data signal to the sub-pixels of the i-th row, and the second data line 194 may provide a data signal to the sub-pixels of the (i+1)-th row. For example, in an array substrate, the first data line 193 may provide a data signal to sub-pixels of an even row, and the second data line 194 may provide a data signal to sub-pixels of an odd row, but not limited thereto. However, the data lines in the array substrate shown in FIG. 6 provide data signals to the sub-pixels in a column manner. One skilled in the art may select an appropriate configuration manner of the data lines according to actual application scenarios.

Figure 8:
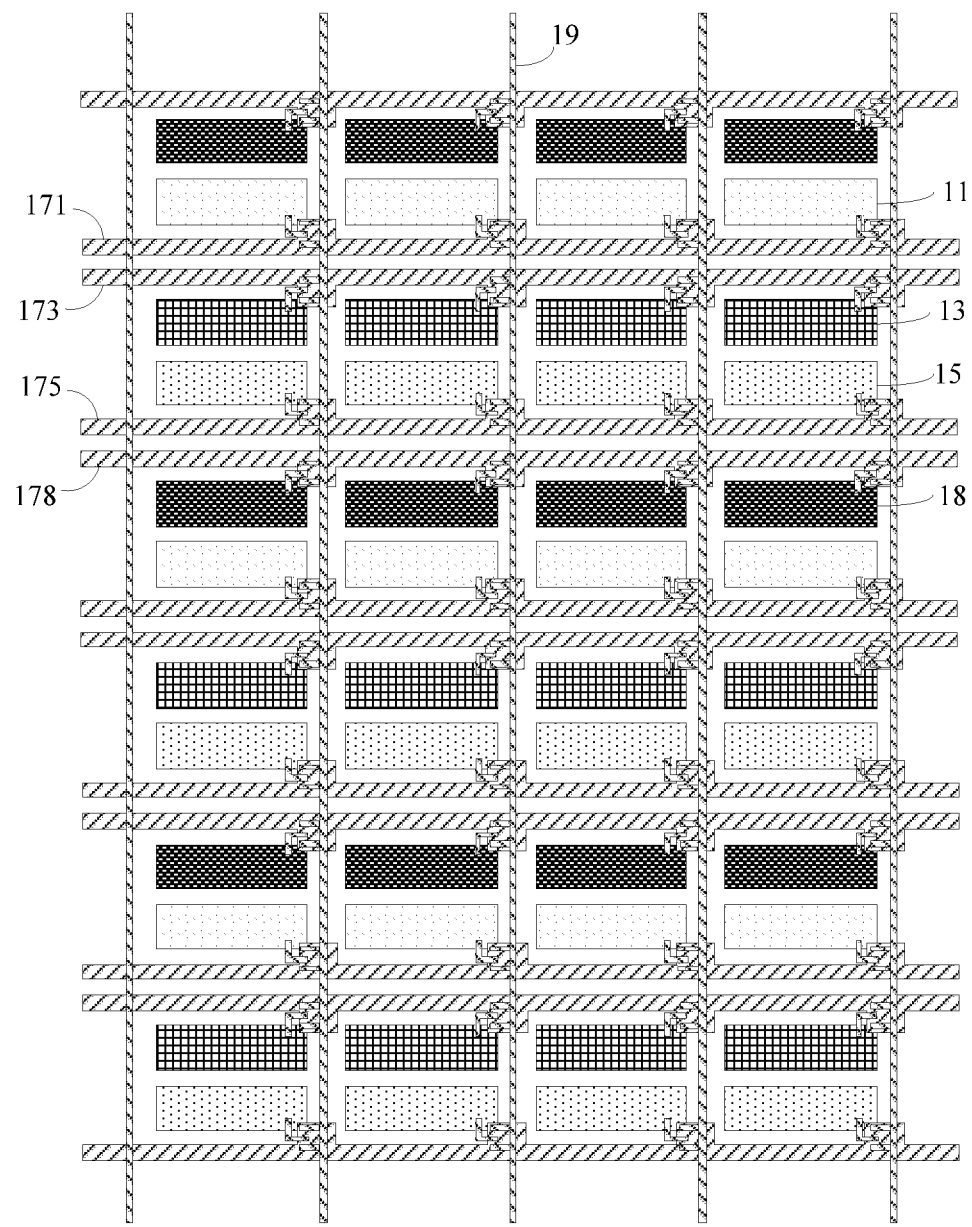
FIG. 8 schematically shows a top view of an array substrate according to a fourth embodiment of the present disclosure.

In an exemplary embodiment of the present disclosure, there is further provided an array substrate including pixel units having four sub-pixels. Referring to FIG. 8, each pixel unit in the array substrate according to the fourth embodiment of the present disclosure may include a first color sub-pixel, a second color sub-pixel, a third color sub-pixel and a fourth color sub-pixel. The pixel row consisting of the first color sub-pixel may be a first sub-pixel row 11, the pixel row consisting of the second color sub-pixel may be a second sub-pixel row 13, the pixel row consisting of the third color sub-pixel may be a third sub-pixel row 15, and the pixel row consisting of the fourth color sub-pixel may be a fourth sub-pixel row 18.

In the present embodiment, both a gate line 171 for driving the first sub-pixel row 11 and a gate line 173 for driving the second sub-pixel row 13 are located between the first sub-pixel row 11 and the second sub-pixel row 15. Both a gate line 175 for driving the three sub-pixel row 15 and a gate line 178 for driving the fourth sub-pixel row 18 are located between the third sub-pixel row 15 and the fourth sub-pixel row 18.

In addition, the array substrate shown in FIG. 8 may further include a plurality of data lines 19. In the pixel array arranged in a manner of a plurality of pixel units in the longitudinal direction and a plurality of pixel units in the horizontal direction, the data line 19 may be configured to provide a data signal to sub-pixels of an n-th column, and the data line 19 is located between the sub-pixels of the n-th column and a column of sub-pixels adjacent thereto, n being a positive integer. Referring to FIG. 8, each data line 19 is located between adjacent two columns of sub-pixels respectively, for driving a column of sub-pixels at a left side of the data line 19. However, the data line 19 may also be used to drive a column of sub-pixels at a right side of the data line 19, which is not particularly limited in the present exemplary embodiment.

Figure 9:
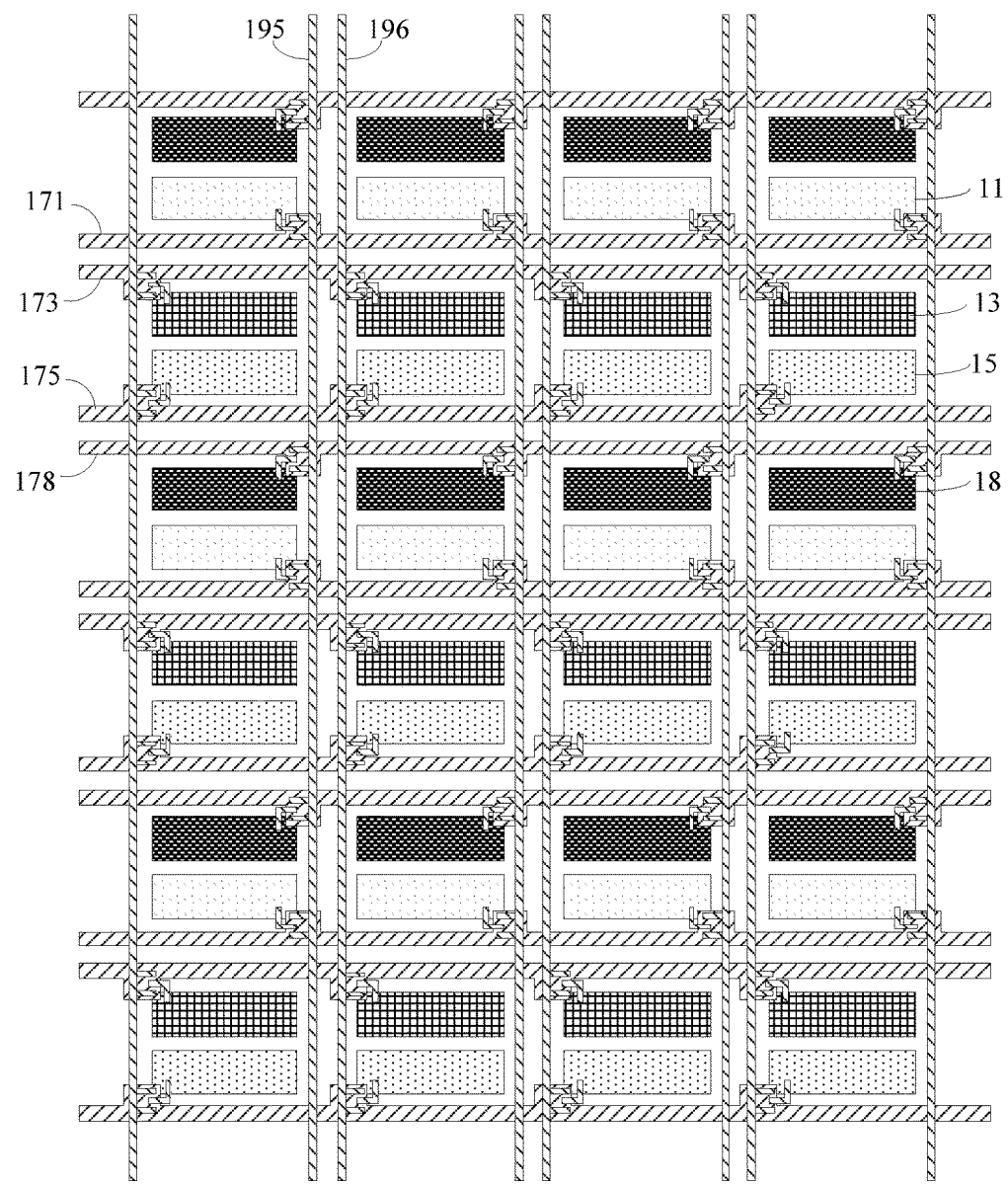
FIG. 9 schematically shows a top view of an array substrate according to a fifth embodiment of the present disclosure.

FIG. 9 schematically shows a top view of an array substrate according to a fifth embodiment of the present disclosure. Similar to the array substrate according to the fourth embodiment of the present disclosure as shown in FIG. 8, each row of pixel units in the array substrate as shown in FIG. 9 may include a first sub-pixel row 11, a second sub-pixel row 13, a third sub-pixel row 15, and a fourth sub-pixel row 18. Both a gate line 171 for driving the first sub-pixel row 11 and a gate line 173 for driving the second sub-pixel row 13 are located between the first sub-pixel row 11 and the second sub-pixel row 15. Both a gate line 175 for driving the third sub-pixel row 15 and a gate line 178 for driving the fourth sub-pixel row 18 are located between the third sub-pixel row 15 and the fourth sub-pixel row 18.

In addition, as shown in FIG. 9, the array substrate may further include a plurality of first data lines 195 and a plurality of second data lines 196. In particular, adjacent two rows of sub-pixels may be defined as a sub-pixel row group, and then the plurality of first data lines 195 and the plurality of second data lines 196 may be used to alternately provide data signals to all of the sub-pixel groups in the array substrate. For example, in the array substrate, the first sub-pixel row of the n-th row pixel units and the fourth sub-pixel row of the (n−1)-th row pixel units may be defined as a sub-pixel row group, and the first data line 195 may provide a data signal to the sub-pixel row group. Besides, the second sub-pixel row of the n-th row pixel units and the third sub-pixel row of the n-th row pixel units may be defined as another sub-pixel row group, and the second data line 196 may provide a data signal to the another sub-pixel row group, where n is a positive integer greater than one. But not limited thereto, the sub-pixel row group described in the present embodiment may be constituted by sub-pixels of any adjacent two rows.

It will be understood by those skilled in the art that, other arrangements of the data lines are present in the present disclosure. For example, in units of pixel units, different data lines may be used to provide data signals to different pixel units, respectively. In addition, equivalents of the above-described schemes should be construed as falling within the conception of the present disclosure.

Further, in the present exemplary embodiment, there is further provided a method of manufacturing an array substrate, including: forming a plurality of pixel units arranged in rows and columns, wherein each row of the pixel units includes a first sub-pixel row, a second sub-pixel row and a third sub-pixel row being adjacent successively; and forming a plurality of gate lines, wherein each of the gate lines is configured to drive one sub-pixel row, and gate lines for driving the first sub-pixel row and the second sub-pixel row in a same pixel unit are configured to be located between the first sub-pixel row and the second sub-pixel row in the pixel unit.

Further, in the present exemplary embodiment, there is further provided a display panel including the array substrate described above.

Further, in the present exemplary embodiment, there is further provided a display device which may include the display panel described above. The display device may be a product or a part having any display function such as a mobile phone, a tablet computer, a television set, a monitor, a notebook computer, a digital photo frame, a navigator, or the like.

The array substrate, display panel and display device provided by the present disclosure may achieve a smaller BM width, thus increasing the aperture ratio and improving the light transmission efficiency.

In a technical solution provided by some embodiments of the present disclosure, gate lines for driving the first sub-pixel row and the second sub-pixel row in a same pixel unit are configured to be located between the first sub-pixel row and the second sub-pixel row in the pixel unit, which reduces a width of a BM in an array substrate, increases the aperture ratio and improves the light transmission efficiency.

Other embodiments of the present disclosure will be apparent to those skilled in the art from consideration of the specification and practice of the present disclosure disclosed here. The present application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. An LCD display device comprising:
   a display panel comprising an array substrate, a color film substrate, and liquid crystals between the array substrate and the color film substrate; and
   a backlight unit disposed under the display panel;
   wherein the array substrate comprises:
      a plurality of pixel units arranged in rows and columns, each row of the plurality of pixel units comprising a first sub-pixel row, a second sub-pixel row, and a third sub-pixel row, wherein the first, second, and third sub-pixel rows are arranged adjacent to each other, successively; and
      a plurality of gate lines, each gate line of the plurality of gate lines being configured to drive one sub-pixel row;
      wherein a first gate line for driving the first sub-pixel row and a second gate line for driving the second sub-pixel row in a same pixel unit are both located between the first sub-pixel row and the second sub-pixel row in the same pixel unit; and
      wherein a distance between the first gate line and the second gate line is smaller than a distance between each of the first and second gate lines and the first and second sub-pixel rows, respectively.

2. The array substrate according to claim 1, wherein the first sub-pixel row is a first color sub-pixel row, the second sub-pixel row is a second color sub-pixel row and the third sub-pixel line is a third color sub-pixel line.

3. The array substrate according to claim 1, wherein each row of the plurality of pixel units further comprises:
   a fourth sub-pixel row adjacent to the third sub-pixel row;
   wherein a third gate line for driving the third sub-pixel row and a fourth gate line for driving the fourth sub-pixel row in a same pixel unit are both located between the third sub-pixel row and the fourth sub-pixel row in the same pixel unit.

4. The array substrate according to claim 3, wherein the fourth sub-pixel row is a fourth color sub-pixel row.

5. The array substrate according to claim 1 further comprising:
   a plurality of data lines, one of the plurality of data lines being configured to provide a data signal to sub-pixels of an n-th column, and the data line being located between the sub-pixels of the n-th column and a column of sub-pixels adjacent thereto, n being a positive integer.

6. The array substrate according to claim 1 further comprising:
   a plurality of first data lines, one of the plurality of first data lines being configured to provide a data signal to sub-pixels of an n-th column and located between the sub-pixels of the n-th column and sub-pixels of an (n+1)-th column; and
   a plurality of second data lines, one of the plurality of second data lines being configured to provide a data signal to the sub-pixels of the (n+1)-th column and located between the first data line and the sub-pixels of the (n+1)-th column,
   where all values of the n are either odd or even.

7. The array substrate according to claim 1 further comprising:
   a plurality of first data lines, one of the plurality of first data lines being configured to provide a data signal to sub-pixels of an i-th row and located between sub-pixels of an n-th column and sub-pixels of an (n+1)-th column; and
   a plurality of second data lines, one of the plurality of second data lines being configured to provide a data signal to sub-pixels of an (i+1)-th row and located between the first data line and the sub-pixels of the (n+1)-th column,
   where all of the i and n are positive integers.

8. A method of manufacturing a liquid crystal display device, the method comprising:
   forming an array substrate comprising a plurality of pixel units arranged in rows and columns, wherein each row of the plurality of pixel units comprises a first sub-pixel row, a second sub-pixel row, and a third sub-pixel row, wherein the first, second, and third sub-pixel rows are arranged adjacent to each other, successively; and
   forming a plurality of gate lines, wherein each gate line of the plurality of gate lines is configured to drive one sub-pixel row, wherein the plurality of gate lines comprises a first gate line for driving the first sub-pixel row and a second gate line for driving the second sub-pixel row in a same pixel unit, wherein the first and second gate lines are both located between the first sub-pixel row and the second sub-pixel row in the same pixel unit, and wherein a distance between the first gate line and the second gate line is smaller than a distance between each of the first and second gate lines and the first and second sub-pixel rows, respectively;
   forming a display panel comprising the array substrate, a color film substrate, and liquid crystals between the array substrate and the color film substrate; and
   forming a backlight unit under the display panel.

9. The method according to claim 8, wherein the first sub-pixel row is a first color sub-pixel row, the second sub-pixel row is a second color sub-pixel row and the third sub-pixel line is a third color sub-pixel line.

10. The method according to claim 8, wherein:
    each row of the plurality of pixel units further comprises a fourth sub-pixel row adjacent to the third sub-pixel row; and
    the plurality of gate lines further comprises a third gate line for driving the third sub-pixel row and a fourth gate line for driving the fourth sub-pixel row in a same pixel unit, wherein the third and fourth gate lines are both located between the third sub-pixel row and the fourth sub-pixel row in the same pixel unit.

11. The method according to claim 10, wherein the fourth sub-pixel row is a fourth color sub-pixel row.

12. The method according to claim 8 further comprising:
    forming a plurality of data lines, one of the plurality of data lines being configured to provide a data signal to sub-pixels of an n-th column, and the data line being located between the sub-pixels of the n-th column and a column of sub-pixels adjacent thereto, n being a positive integer.

13. The method according to claim 8 further comprising:
forming a plurality of first data lines, one of the plurality of first data lines being configured to provide a data signal to sub-pixels of an n-th column and located between the sub-pixels of the n-th column and sub-pixels of an (n+1)-th column; and
forming a plurality of second data lines, one of the plurality of second data lines being configured to provide a data signal to the sub-pixels of the (n+1)-th column and located between the first data line and the sub-pixels of the (n+1)-th column,
where all values of the n are either odd or even.

14. The method according to claim 8 further comprising:
forming a plurality of first data lines, one of the plurality of first data lines being configured to provide a data signal to sub-pixels of an i-th row and located between sub-pixels of an n-th column and sub-pixels of an (n+1)-th column; and
forming a plurality of second data lines, one of the plurality of second data lines being configured to provide a data signal to sub-pixels of an (i+1)-th row and located between the first data line and the sub-pixels of the (n+1)-th column,
where all of the i and n are positive integers.

* * * * *